United States Patent
Park et al.

(10) Patent No.: US 7,239,004 B2
(45) Date of Patent: Jul. 3, 2007

(54) SEMICONDUCTOR DEVICE HAVING FUSE AND CAPACITOR AT THE SAME LEVEL AND METHOD OF FABRICATING THE SAME

(75) Inventors: Seung-Han Park, Seoul (KR); Ki-Young Lee, Hwaseong-gun (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 10/946,343

(22) Filed: Sep. 22, 2004

(65) Prior Publication Data

US 2005/0067671 A1    Mar. 31, 2005

(30) Foreign Application Priority Data

Sep. 25, 2003    (KR)    ...................... 10-2003-0066650

(51) Int. Cl.
*H01L 29/00*    (2006.01)
(52) U.S. Cl. ................................ 257/529; 257/E23.149
(58) Field of Classification Search ................ 257/529, 257/E23.149
See application file for complete search history.

(56) References Cited

U.S. PATENT DOCUMENTS 5,795,819 A * 8/1998 Motsiff et al. .............. 438/618
6,461,914 B1 * 10/2002 Roberts et al. ............. 438/253
6,495,426 B1 * 12/2002 Cheng et al. ............... 438/393
6,627,968 B2 * 9/2003 Cheng et al. ............... 257/529
6,894,331 B2 * 5/2005 Yoshitomi et al. .......... 257/296
6,924,207 B2 * 8/2005 Son et al. ................... 438/396
2001/0020713 A1 * 9/2001 Yoshitomi et al. .......... 257/306
2002/0006700 A1 * 1/2002 Kanamori et al. .......... 438/253
2005/0224908 A1 * 10/2005 Barth ......................... 257/528

FOREIGN PATENT DOCUMENTS

| KR | 07-142683 | 6/1995 |
| KR | 2002-0015516 | 2/2002 |
| KR | 1020020015516 A | 2/2002 |
| KR | 1020030002123 A | 1/2003 |

* cited by examiner

*Primary Examiner*—Lex Malsawma
(74) *Attorney, Agent, or Firm*—Volentine & Whitt, PLLC

(57) ABSTRACT

In a semiconductor device and a method of fabricating the same, a fuse and a capacitor are formed at a same level on a semiconductor substrate having a fuse area and a capacitor area. The fuse is placed on the fuse area, and a lower plate is placed on the capacitor area. The lower plate is located on a same plane as the fuse. Further, an upper plate is located above the lower plate, and a capping layer is interposed between the lower plate and the upper plate. Therefore, the fuse and the capacitor can be formed at the same time, thereby minimizing photolithography and etch process steps.

12 Claims, 8 Drawing Sheets

SEMICONDUCTOR DEVICE HAVING FUSE AND CAPACITOR AT THE SAME LEVEL AND METHOD OF FABRICATING THE SAME

CROSS-REFERENCE TO RELATED APPLICATION

This application claims the benefit of Korean Patent Application No. 2003-66650, filed on Sep. 25, 2003, the disclosure of which is hereby incorporated herein by reference in its entirety.

BACKGROUND OF THE INVENTION

1. Field of the Invention

The present invention relates to a semiconductor device and a fabrication method thereof and, more particularly, to a semiconductor device having a fuse and a capacitor at the same level and a method of fabricating the same.

2. Description of the Related Art

A merged memory and logic device, such as a system on chip (SOC) is structured to include memory elements and logic elements together in one semiconductor device. The logic elements typically comprise analog capacitors.

A fuse is widely used in a memory device to provide the memory device with redundancy. The production yield of the memory device can be increased by use of the fuse. With the high integration of a semiconductor device, the height of the semiconductor device is increased. Therefore, a method of forming the fuse on the upper portion of the semiconductor device is widely used in order to facilitate the fusing.

In the meantime, a metal-insulator-metal (MIM) capacitor is widely used as an analog capacitor because its capacitance is easy to control, and its characteristics of the voltage coefficient of capacitance is better than that of a poly Si-insulator-poly Si (PIP) capacitor. Therefore, the merged memory and logic device typically has a fuse and an MIM capacitor together.

FIG. 1 is a sectional view illustrating a conventional MIM capacitor, and a method of fabricating the same. Referring to FIG. 1, the MIM capacitor includes a lower plate 15b placed on a semiconductor substrate 11, an upper plate 19 located above the lower plate, and a capping layer 17 interposed between the lower plate 15b and the upper plate 19. The lower plate 15b is located on the same plane as a lower interconnection line 15a.

In the meantime, the lower interconnection line 15a is electrically connected to an upper interconnection line 23a passing over the lower interconnection line 15a through a via plug. The upper plate 19 is electrically connected to another upper interconnection line 23b passing over the upper plate 19 through a via plug. The upper interconnection line 23a and the another upper interconnection line 23b are placed in a same plane.

Further, the capping layer 17 may cover the upper surfaces of the lower interconnection line 15a and the lower plate 15b. The capping layer 17 has an opening exposing a predetermined portion of the lower interconnection line 15a such that the lower interconnection line 15a is electrically connected to the upper interconnection line 23a.

Now, hereinafter, a description is made of a method of fabricating the conventional MIM capacitor. Referring to FIG. 1, a semiconductor substrate 11 is provided. The semiconductor substrate may have discrete devices, such as transistors, and interconnection lines. A lower insulating layer 13 is formed on the semiconductor substrate 11. The lower insulating layer 13 is patterned using a photolithography and etch process to form a line trench and a lower plate trench.

A lower conductive layer is formed on the semiconductor substrate having the trenches. The lower conductive layer may be formed of a copper (Cu) layer. In the case of forming the lower conductive layer as a Cu layer, a Cu diffusion barrier layer and a seed layer are typically formed before the Cu layer is formed. After the lower conductive layer is formed, the lower conductive layer is planarized until the top surface of the lower insulating layer 13 is exposed, to form a lower interconnection line 15a filling the line trench, and a lower plate 15b filling the lower plate trench 15b.

A capping layer 17 and a plate conductive layer are sequentially formed on the semiconductor substrate having the lower interconnection line 15a and the lower plate 15b. In the case of forming the lower conductive layer as a Cu layer, the capping layer 17 may be formed of a dielectric layer capable of preventing the diffusion of Cu. The plate conductive layer is patterned using a photolithography and etch process to form an upper plate 19 above the lower plate 15b.

An upper insulating layer 21 is formed on the semiconductor substrate having the upper plate 19. The upper insulating layer 21 and the capping layer 17 are patterned through a photolithography and etch process to form via holes exposing the lower interconnection line 15a and the upper plate 19.

An upper conductive layer is formed on the semiconductor substrate having the via holes, and the upper conductive layer is patterned through a photolithography and etch process. As a result, there is formed an upper interconnection line 23a, which is electrically connected to the lower interconnection line 15a, and there is formed another upper interconnection line 23b, which is electrically connected to the upper plate 19. The upper interconnection lines 23a, 23b may be formed by using a damascene process or a dual damascene process.

The conventional MIM capacitor can be fabricated by forming the lower interconnection line 15a and the lower plate 15b by using a single patterning process, and also by forming the upper interconnection line 23a and the another upper interconnection line 23b by using a single patterning process, which are advantageous.

However, the fabrication of the conventional MIM capacitor requires additional photolithography and etch processes in order to form the upper plate 19. Further, in the case of forming the lower interconnection line 15a and the lower plate 15b using a Cu damascene process, alignment keys are necessary in order to align the upper plate 19 above the lower plate 15b. Therefore, additional photolithography and etch processes are necessary to form the alignment keys. As a result, in order to form the conventional MIM capacitor, there are additionally required photolithography and etch processes for forming the alignment keys, and photolithography and etch processes for forming the upper plate.

A fabrication method of a capacitor without the use of the additional photolithography and etch processes is disclosed in U.S. Pat. No. 6,495,426 (Cheng et al.) entitled "Method for simultaneous formation of integrated capacitor and fuse". In the method disclosed in U.S. Pat. No. 6,495,426, the fuse and the upper plate are formed using a single photolithography and etch process. Therefore, the additional photolithography and etch processes are not necessary to form the upper plate.

However, in the method disclosed in U.S. Pat. No. 6,495,426, a fuse is formed using a process other than an interconnection line formation process. Therefore, a capping layer interposed between a lower plate and the upper plate should be patterned by using a photolithography and etch process, and a photolithography and etch process for forming the fuse and the upper plate is required.

Accordingly, there are required a semiconductor device fabrication method being capable of forming a fuse and a capacitor while minimizing the photolithography and etch process steps, and a semiconductor device fabricated thereby.

SUMMARY OF THE INVENTION

Exemplary embodiments of the present invention provide a semiconductor device having a fuse and an MIM capacitor, its fabrication process involving minimizing photolithography and etch process steps.

Another object of the present invention is to provide a method of fabricating a semiconductor device having a fuse and a capacitor while minimizing photolithography and etch process steps.

In accordance with an exemplary embodiment, the present invention provides a semiconductor device having a fuse and a capacitor at the same level. The semiconductor device includes a semiconductor substrate having a fuse area and a capacitor area. The fuse is placed on the fuse area, and a lower plate is placed on the capacitor area. In addition, the lower plate is located on the same plane as the fuse. Further, an upper plate is located above the lower plate, and a capping layer is interposed between the lower plate and the upper plate. As such, the fuse and the lower plate may be formed through an identical patterning process.

The fuse and the lower plate may be a Cu layer. Further, the upper plate may be at least one conductive layer selected from the group consisting of tantalum (Ta), tantalum nitride (TaN), titanium (Ti), titanium nitride (TiN) and aluminum (Al) layers, or may be one layer with multiple component films (referred to as "one multiple layer") selected from the group consisting of Ta/TaN, Ti/TiN, TaN/Al, Ta/Al, Ta/TaN/Al, TaN/Al/TiN, TiN/Al, and Ti/TiN/Al layers.

In the case that the fuse and the lower plate are a Cu layer, the capping layer may be a dielectric layer capable of preventing the diffusion of Cu. The dielectric layer, being capable of preventing the diffusion of Cu, can prevent the Cu atoms from diffusing from the lower plate to the upper plate, and can prevent dielectric property deterioration of the capping layer due to the Cu atoms. The capping layer may be at least one layer selected from the group consisting of a silicon nitride (SiN) layer and a silicon carbide (SiC) layer, and more preferably the capping layer is a SiN layer.

The capping layer may be extended and may cover the top surface of the fuse. The capping layer covering the top surface of the fuse functions to prevent the contamination of the fuse.

The semiconductor device may further include a passivation layer covering the fuse area and the capacitor area on the capping layer. The passivation layer has a fuse window crossing over the fuse, and a capacitor hole exposing the capping layer interposed between the upper plate and the lower plate. Therefore, the passivation layer can be patterned using a single photolithography and etch process to form the fuse window and the capacitor hole.

The semiconductor device may further include a pad area. A metal pad may be placed on the pad area. In addition, the metal pad may be located on the same plane as the fuse. Further, a bonding pad is placed on the metal pad, and electrically connected to the metal pad. The metal pad may be the same material layer as the fuse, and the bonding pad may be the same material layer as the upper plate. Therefore, the fuse, the lower plate and the metal pad can be formed through an identical process, and the bonding pad and the upper plate can be formed by using an identical photolithography and etch process.

The passivation layer may also cover the pad area. In this case, the passivation layer may include a pad hole exposing the metal pad.

In accordance with an exemplary embodiment, the present invention provides a method of fabricating a semiconductor device having a fuse and a capacitor at the same level. The method includes providing a semiconductor substrate having a fuse area and a capacitor area. A fuse and a lower plate are formed on the fuse area and the capacitor area respectively, the fuse and the lower plate being separated by an interlayer insulating layer. A capping layer and a passivation layer are sequentially formed on the semiconductor substrate having the fuse and the lower plate. The passivation layer is patterned to form a fuse window exposing the capping layer, and a capacitor hole exposing the capping layer, on the fuse area and the capacitor area respectively. The fuse window is formed to cross over the fuse, and the capacitor hole is formed to be located above the lower plate. An upper conductive layer is formed on the semiconductor substrate having the fuse window and the capacitor hole. The upper conductive layer is patterned to form an upper plate located above the lower plate, and concurrently, the upper conductive layer, formed inside the fuse window, is removed. In the method, the fuse and the lower plate can be formed using an identical process, and the fuse window and the capacitor hole can be formed using an identical photolithography and etch process.

The formation of the fuse and the lower plate, separated by the interlayer insulating layer, may include forming the interlayer insulating layer on the semiconductor substrate. The interlayer insulating layer is patterned to form a fuse trench and a lower plate trench on the fuse area and the capacitor area respectively. Herein, the fuse trench and the lower plate trench can be separated from each other. A lower conductive layer is formed on the semiconductor substrate having the fuse trench and the lower plate trench. Then, the lower conductive layer is planarized until the interlayer insulating layer is exposed. As a result, there are formed the fuse and the lower plate separated by the interlayer insulating layer.

The lower conductive layer may be a Cu layer. The Cu layer can be formed using a typical method such as a CVD method or a plating method, and may include a metal diffusion barrier layer and a seed layer. In the case that the lower conductive layer is a Cu layer, the capping layer may be formed as a dielectric layer capable of preventing the diffusion of Cu.

The capping layer may be formed of at least one layer selected from the group consisting of SiN and SiC layers, and more preferably is formed of a SiN layer. Further, the capping layer may be formed as having a thickness of 200 Å to 1000 Å.

The passivation layer may be formed of at least one insulating layer selected from the group consisting of an oxide layer and a nitride layer, and can be formed as having a thickness of 2000 Å to 20000 Å.

The upper conductive layer may be at least one conductive layer selected from the group consisting of Ta, TaN, Ti, TiN and Al layers, or may be one multiple layer selected from the group consisting of Ta/TaN, Ti/TiN, TaN/Al, Ta/Al, Ta/TaN/Al, TaN/Al/TiN, TiN/Al, and Ti/TiN/Al layers. The upper conductive layer may be formed as having a thickness of 500 Å to 10000 Å.

In another exemplary embodiment of the present invention, the present invention provides a method of fabricating a semiconductor device having a fuse and a capacitor at the same level. The method may include providing a semiconductor substrate having a pad area, a fuse area, and a capacitor area. A metal pad, a fuse, and a lower plate may be formed on the pad area, the fuse area and the capacitor area respectively, and the metal pad, the fuse, and the lower plate are separated by an interlayer insulating layer. A capping layer and a passivation layer are sequentially formed on the semiconductor substrate having the metal pad, the fuse, and the lower plate. The passivation layer and the capping layer are patterned to form a fuse window exposing the capping layer on the fuse, and a capacitor hole exposing the capping layer on the lower plate, along with a pad hole exposing the metal pad. Herein, the fuse window is formed to cross over the fuse. An upper conductive layer is formed on the semiconductor substrate having the pad hole, the fuse window, and the capacitor hole. The upper conductive layer is patterned to form a bonding pad electrically connected to the metal pad through the pad hole, and an upper plate located above the lower plate, and concurrently, the upper conductive layer formed inside the fuse window is removed. In accordance with this method, the metal pad, the fuse, and the lower plate can be formed using an identical process, and the fuse window and the capacitor hole can be formed using an identical photolithography and etch process. Further, the bonding pad and the upper plate can be formed using an identical photolithography and etch process. Therefore, the capacitor can be formed using a patterning process for forming the fuse and the bonding pad without additional photolithography and etch processes.

The formation of the metal pad, the fuse, and the lower plate separated by the interlayer insulating layer may include forming an interlayer insulating layer on the semiconductor substrate. The interlayer insulating layer is patterned to form a pad trench, a fuse trench, and a lower plate trench, on the pad area, the fuse area and the capacitor area respectively. The pad trench, the fuse trench and the lower plate trench are separated from one another. A lower conductive layer is formed on the semiconductor substrate having the pad trench, the fuse trench and the lower plate trench. The lower conductive layer is planarized until the interlayer insulating layer is exposed. As a result, there are formed the metal pad, the fuse, and the lower plate separated by the interlayer insulating layer.

The formation of the pad hole, the fuse window, and the capacitor hole may include patterning the passivation layer using a photolithography and partial etch process to form a preliminary fuse window and a preliminary capacitor hole. Herein, the preliminary fuse window is formed to cross over the fuse, and the preliminary capacitor hole is formed to be located above the lower plate, and the passivation layer remains on the bottoms of the preliminary fuse window and the preliminary capacitor hole. The passivation layer is patterned using a photolithography and etch process to form a preliminary pad hole exposing the capping layer on the metal pad. An etch back process is performed on the semiconductor substrate having the preliminary pad hole, the preliminary fuse window, and the preliminary capacitor hole to remove the capping layer exposed on the metal pad, and concurrently, to remove the passivation layer remaining on the bottoms of the preliminary fuse window and the preliminary capacitor hole.

The preliminary fuse window and the preliminary capacitor hole may be formed after the preliminary pad hole is formed.

BRIEF DESCRIPTION OF THE DRAWINGS

The above and other features and advantages of the present invention will become more apparent from the detailed description that follows, with reference to the attached drawings in which.

DETAILED DESCRIPTION OF THE INVENTION

Figure 1:
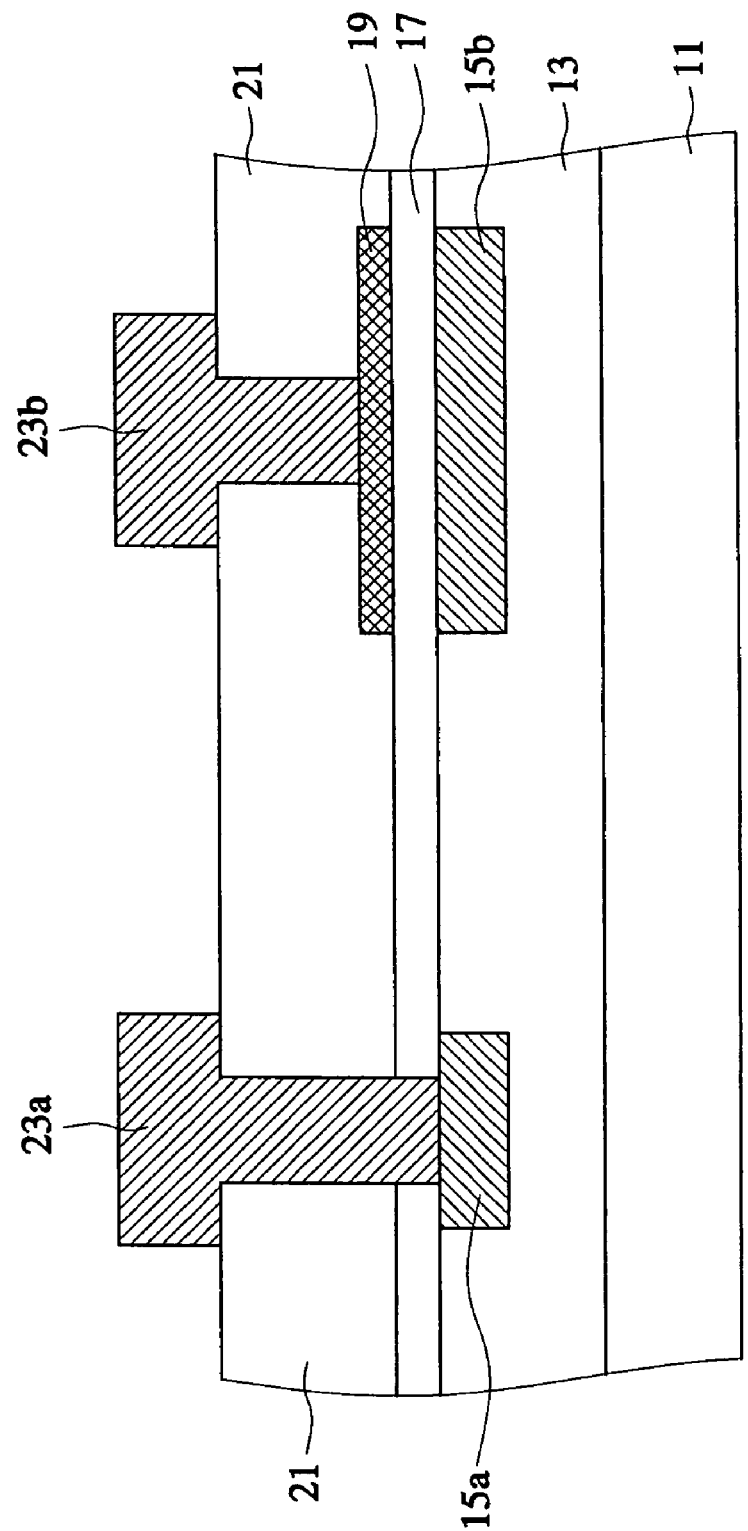
FIG. 1 is a sectional view illustrating a conventional MIM capacitor.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

Figure 2:
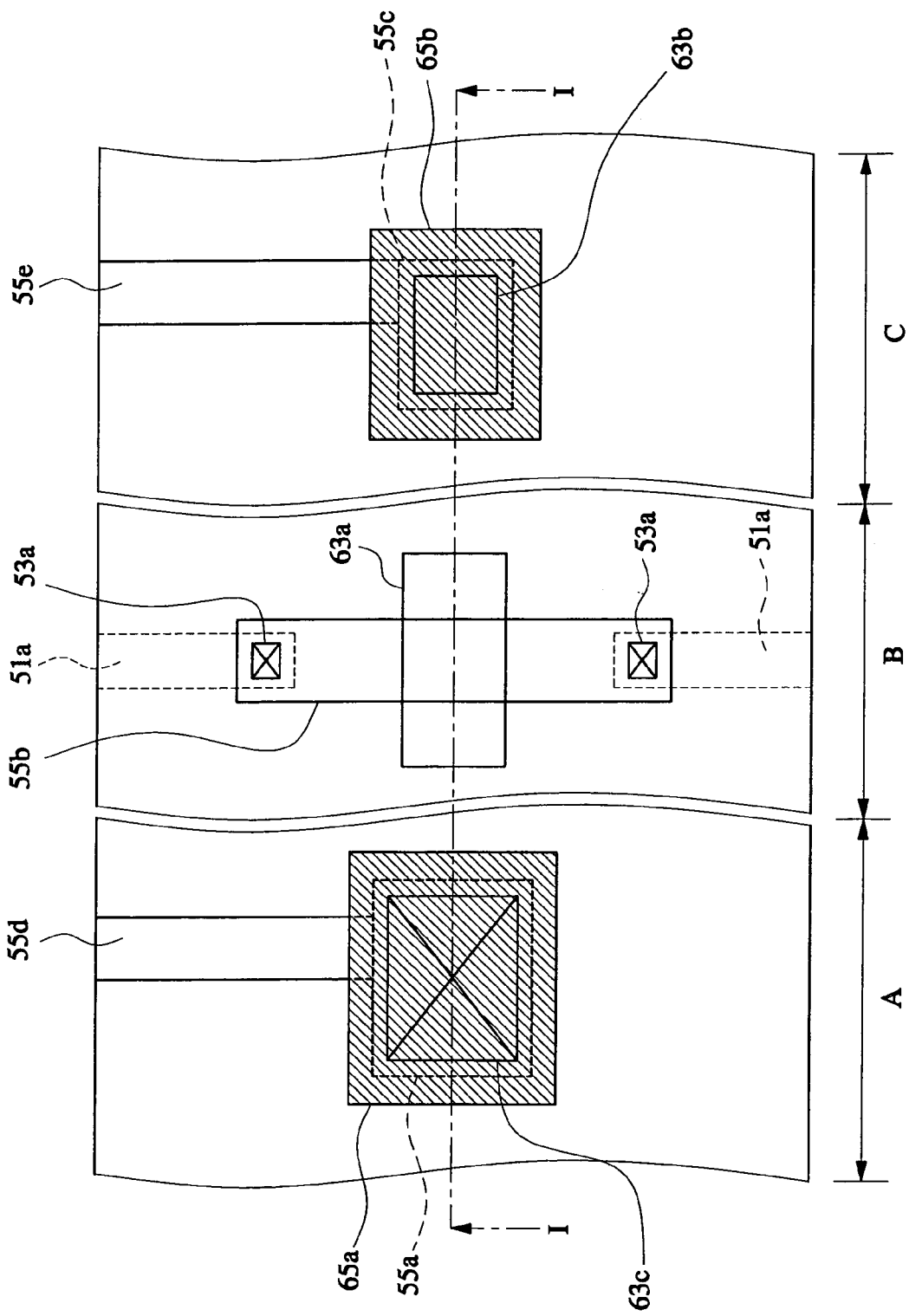
FIG. 2 is a plane view illustrating a semiconductor device according to one preferred embodiment of the present invention.
Figure 8:
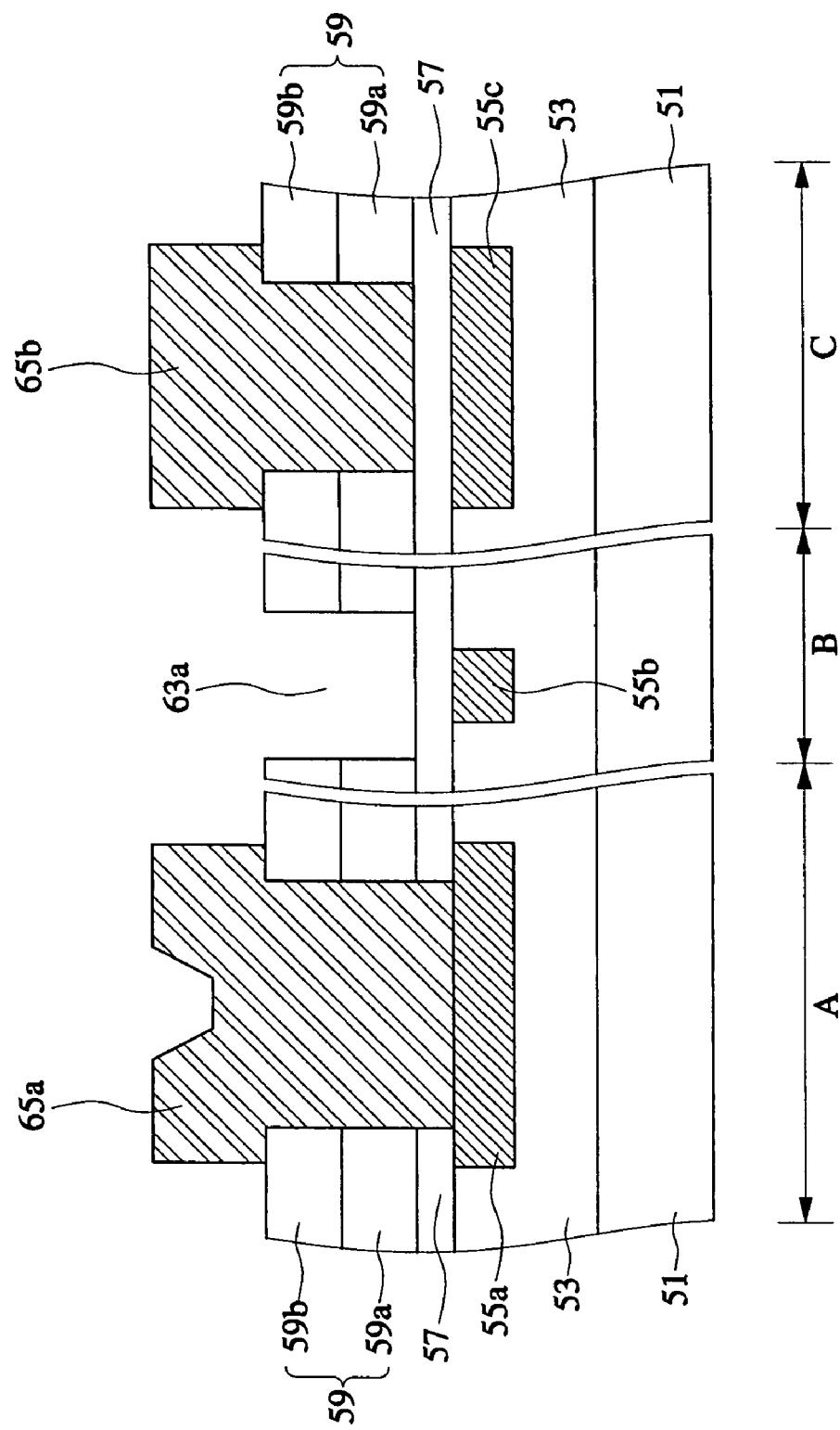

FIG. 2 is a plane view that illustrates a semiconductor device according to a preferred embodiment of the present invention, and FIG. 8 is a sectional view taken along the line of I-I of FIG. 2. First, a description will be made of the semiconductor device according to a preferred embodiment of the present invention, with reference to FIGS. 2 and 8.

Referring to FIGS. 2 and 8, a semiconductor substrate 51 has a fuse area B and a capacitor area C. The semiconductor substrate 51 has memory cells and lines. The fuse area B and the capacitor area C may be covered with an interlayer insulating layer 53.

As shown in FIG. 2, a fuse 55b is placed on the fuse area B. The both ends of the fuse 55b can be electrically connected to lower interconnection lines 51a through via plugs 53a.

A lower plate 55c is placed on the capacitor area C. The lower plate 55c is placed on the same plane as the fuse 55b. The lower plate 55c can be electrically connected to an upper interconnection line 55e which is located on the same plane as the fuse 55b, or can be electrically connected to the lower interconnection line through a via plug.

An upper plate 65b is placed above the lower plate 55c, and a capping layer 57 is interposed between the lower plate 55c and the upper plate 65b. The upper plate 65b can be electrically connected to another lower interconnection line (not shown) through a via plug. As a result, a capacitor, which is comprised of the lower plate 55c, the upper plate 65b, and the capping layer 57, is located on the same plane as the fuse 55b.

The fuse 55b and the lower plate 55c are located on the same plane above the semiconductor substrate, and these can be formed by an identical patterning process, and further, can be formed with the upper interconnection lines.

The fuse 55b and the lower plate 55c may be a copper (Cu) layer, and may further include a diffusion barrier layer and a seed layer sequentially stacked under the Cu layer. Further, the upper plate 65b may be at least one conductive layer selected from the group consisting of Ta, TaN, Ti, TiN and Al layers, or may be one layer with multiple component films (referred to as "one multiple layer") selected from the group consisting of Ta/TaN, Ti/TiN, TaN/Al, Ta/Al, Ta/TaN/Al, TaN/Al/TiN, TiN/Al, and Ti/TiN/Al layers.

If the fuse 55b and the lower plate 55c are Cu layers, the capping layer 57 may be formed as a dielectric layer capable of preventing the diffusion of Cu. The dielectric layer, being capable of preventing the diffusion of Cu, functions to prevent Cu atoms from diffusing from the lower plate 55c to the upper plate 65b, and also prevents the dielectric property deterioration of the capping layer 57 due to Cu atoms. The capping layer 57 may be at least one layer selected from the group consisting of SiN and SiC layers, and more preferably may be an SiN layer.

The capping layer 57 may be extended to cover the top surface of the fuse 55b, as shown. The capping layer 57 covering the top surface of the fuse 55b functions to prevent the contamination of the fuse 55b.

The semiconductor device further has a passivation layer 59 covering the fuse area B and the capacitor area C on the capping layer 57. The passivation layer 59 may be a single layer or multiple layers. The passivation layer 59 has a fuse window 63a crossing over the fuse 55b, and a capacitor hole 63b exposing the capping layer 57 which is interposed between the upper plate 65b and the lower plate 55c. Therefore, the passivation layer 59 can be patterned through a single photolithography and etch process to form the fuse window 63a and the capacitor hole 63b.

The semiconductor substrate 51 may further have a pad area A as shown in FIGS. 2 and 8. The pad area A may be also covered with the interlayer insulating layer 53. A metal pad 55a may be placed on the pad area A. The metal pad 55a is located on the same plane as the fuse 55b and the lower plate 55c. The metal pad 55a is electrically connected to another upper interconnection line 55d.

On the metal pad 55a, there is provided a bonding pad 65a, which is electrically connected to the metal pad 55a. The metal pad 55a is the same material layer as the fuse 55b and the lower plate 55c, and the bonding pad 65a may be the same material layer as the upper plate 65b. Thus, the metal pad 55a, the fuse 55b, and the lower plate 55c may be formed through an identical process, and the bonding pad 65a and the upper plate 65b may be formed_through an identical photolithography and etch process.

In the meantime, the passivation layer 59 may further cover the pad area A. Herein, the passivation layer 59 has a pad hole 63c exposing the metal pad 55a.

As a result, the metal pad 55a, the fuse 55b, and the lower plate 55c are located on the same plane, and may be the same material layer. Thus, the metal pad 55a, the fuse 55b, and the lower plate 55c can be formed through an identical patterning process. Further, the capping layer 57 is exposed through the fuse window 63a and the capacitor hole 63b in the passivation layer 59. Therefore, the passivation layer 59 can be patterned through a single photolithography and etch process to form the fuse window 63a and the capacitor hole 63b at the same time. Further to this, since the bonding pad 65a and the upper plate 65b can be formed of the same material layer, and are located on the same plane, they can be formed through an identical photolithography and etch process.

Now hereinafter, a detailed description will be made of a method of fabricating a semiconductor device according to one preferred embodiment of the present invention. FIGS. 3 to 8 are sectional views illustrating a method of fabricating a semiconductor device taken along the line of I-I of FIG. 2 according to a preferred embodiment of the present invention.

Figure 3:
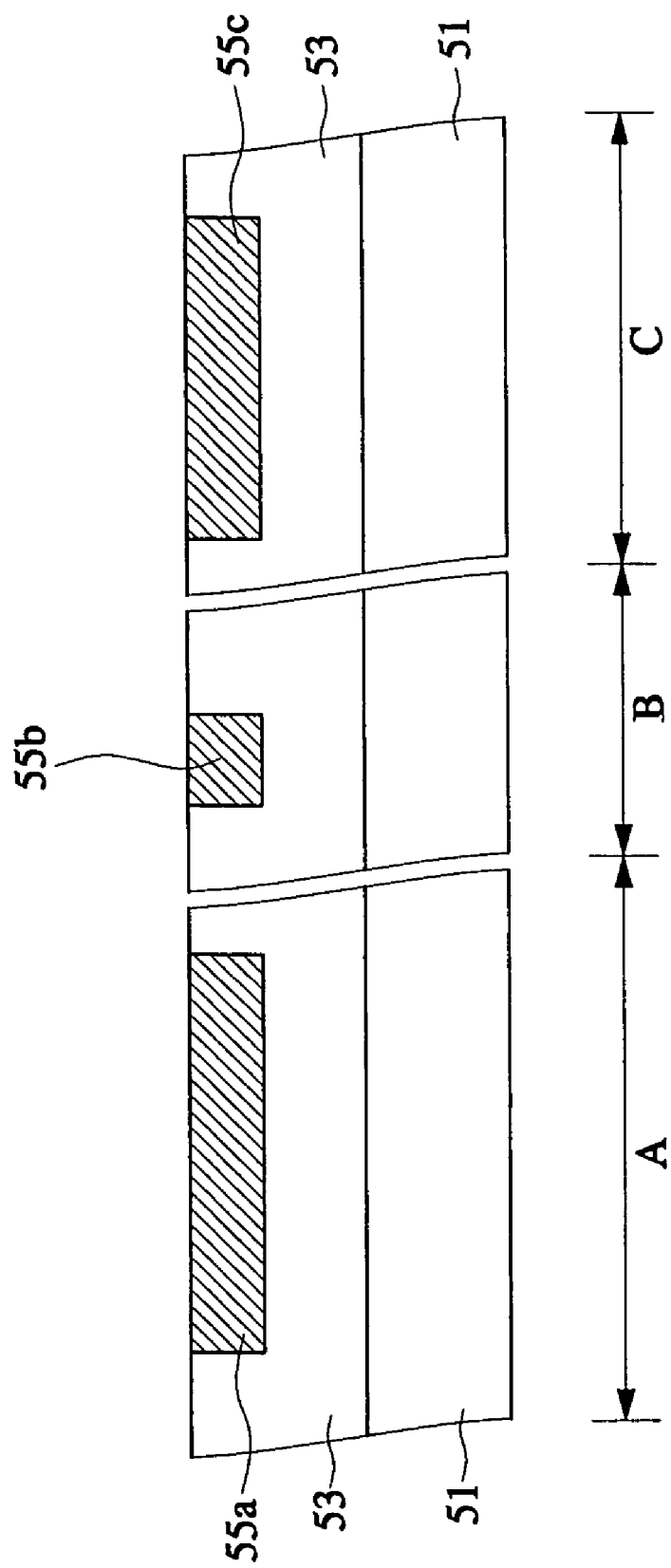
FIGS. 3 to 8 are sectional views illustrating a method of fabricating a semiconductor device taken along the I-I line of FIG. 2, according to one preferred embodiment of the present invention.

Referring to FIGS. 2 and 3, there is provided a semiconductor substrate 51 having a fuse area B and a capacitor area C. The semiconductor substrate 51 may further have a pad area A. Further, lower interconnection lines 51a may be formed on the semiconductor substrate 51.

An interlayer insulating layer 53 is formed on the semiconductor substrate 51. The interlayer insulating layer 53 covers the fuse area B and the capacitor area C, and also covers the pad area A.

The interlayer insulating layer 53 is patterned to form a fuse trench and a lower plate trench on the fuse area B and the capacitor area C respectively. Herein, a pad trench can be formed on the pad area A. Further, trenches for wiring may be formed over the semiconductor substrate 51 to form upper interconnection lines.

A lower conductive layer filling the trenches is formed on the semiconductor substrate having the trenches. The lower conductive layer may be formed of a Cu layer. The Cu layer may be formed using a typical method such as CVD method or plating method. Herein, before the Cu layer is formed, a diffusion barrier metal layer and a seed layer may be further formed.

The lower conductive layer is planarized until the interlayer insulating layer 53 is exposed to form a metal pad 55a filling the pad trench, a fuse 55b filling the fuse trench, and a lower plate 55c filling the lower plate trench. Herein, upper interconnection lines filling the trenches for wiring, such as upper interconnection lines 55d, 55e, can be formed together. The metal pad 55a can be electrically connected to the upper interconnection line 55d, and the fuse 55b can be electrically connected to the lower interconnection lines 51a through via plugs 53a. Further, the lower plate 55c can be electrically connected to the upper interconnection line 55e.

Figure 4:
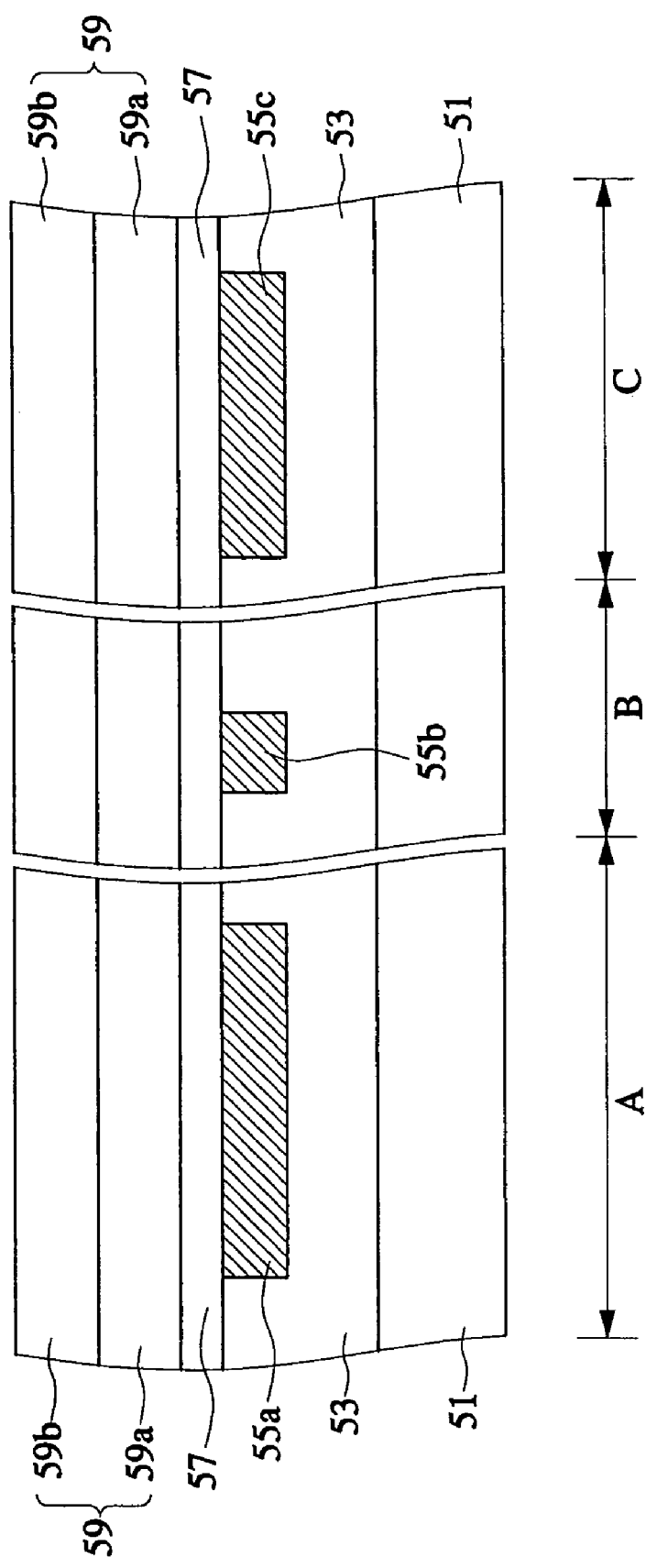

Referring to FIGS. 2 and 4, a capping layer 57 and a passivation layer 59 are sequentially formed on the semiconductor substrate having the metal pad 55a, the fuse 55b, and the lower plate 55c.

In the case that the metal pad 55a, the fuse 55b, and the lower plate 55c are formed of a Cu layer, the capping layer 57 may be formed of a dielectric layer capable of preventing the diffusion of Cu atoms. The capping layer 57 can be formed of at least one layer selected from the group consisting of SiN and SiC layers, and more preferably is formed as an SiN layer. Further, the capping layer 57 is preferably formed as having a thickness of 200 Å to 1000 Å.

The passivation layer 59 can be formed of at least one insulating layer selected from the group consisting of an oxide layer and a nitride layer. The passivation layer 59, as shown in FIG. 4, can be typically formed of dual layers 59a, 59b. The passivation layer 59 may be formed as having a thickness of 2000 Å to 20000 Å.

Figure 5:
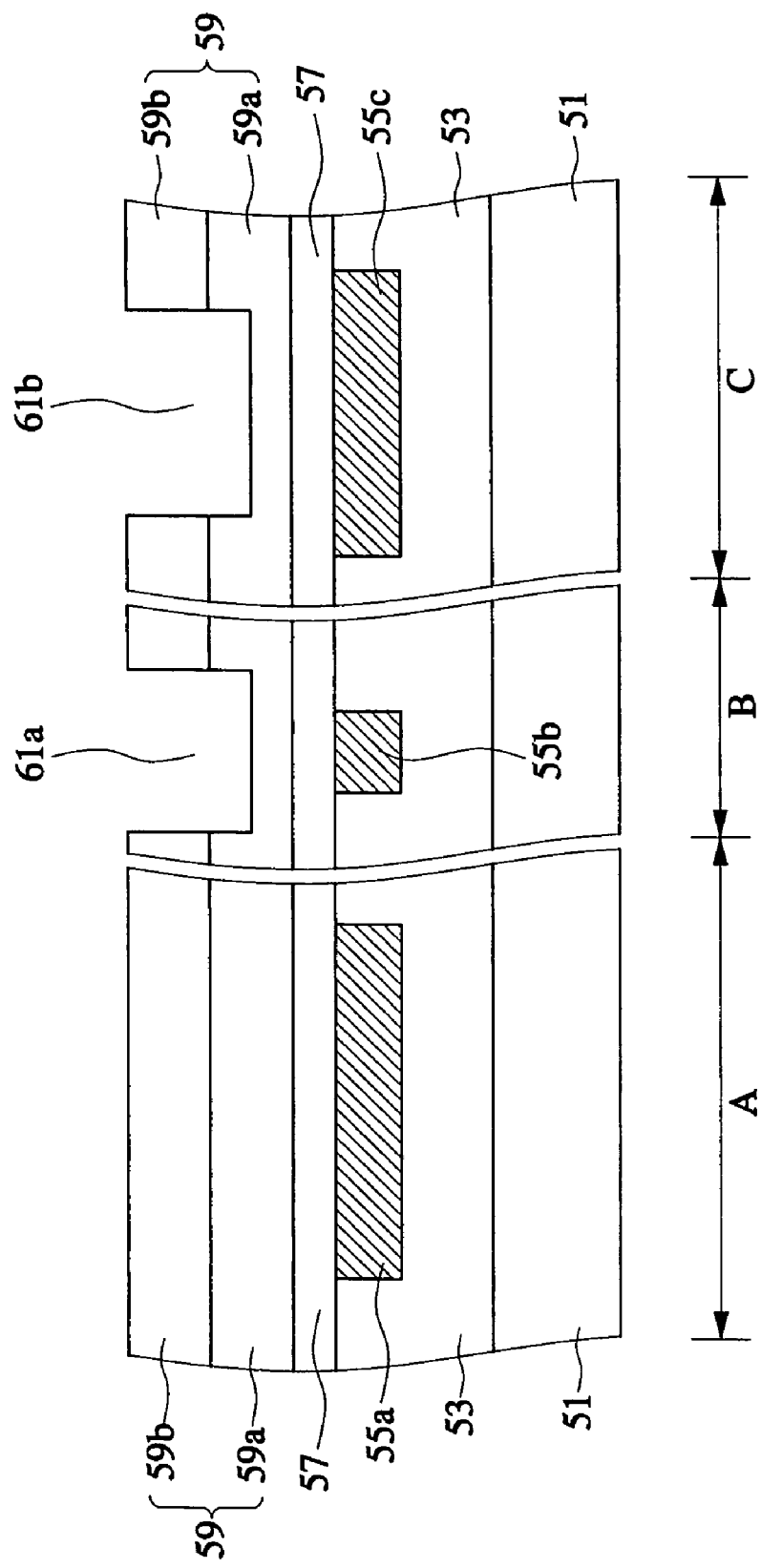

Referring to FIGS. 2 and 5, the passivation layer 59 is patterned through a photolithography and partial etch process to form a preliminary fuse window 61a and a preliminary capacitor hole 61b. The preliminary fuse window 61a is formed to cross over the fuse 55b, and the preliminary capacitor hole 61b is formed to be located above the lower plate 55c. The passivation layer 59 remains under the preliminary fuse window 61a and under the preliminary capacitor hole 61b. Herein, the passivation layer 59 that remains under the preliminary fuse window 61a and the preliminary capacitor hole 61b, may have a thickness that is thin enough so as to be removable during the time when the capping layer 57 is etched.

Figure 6:
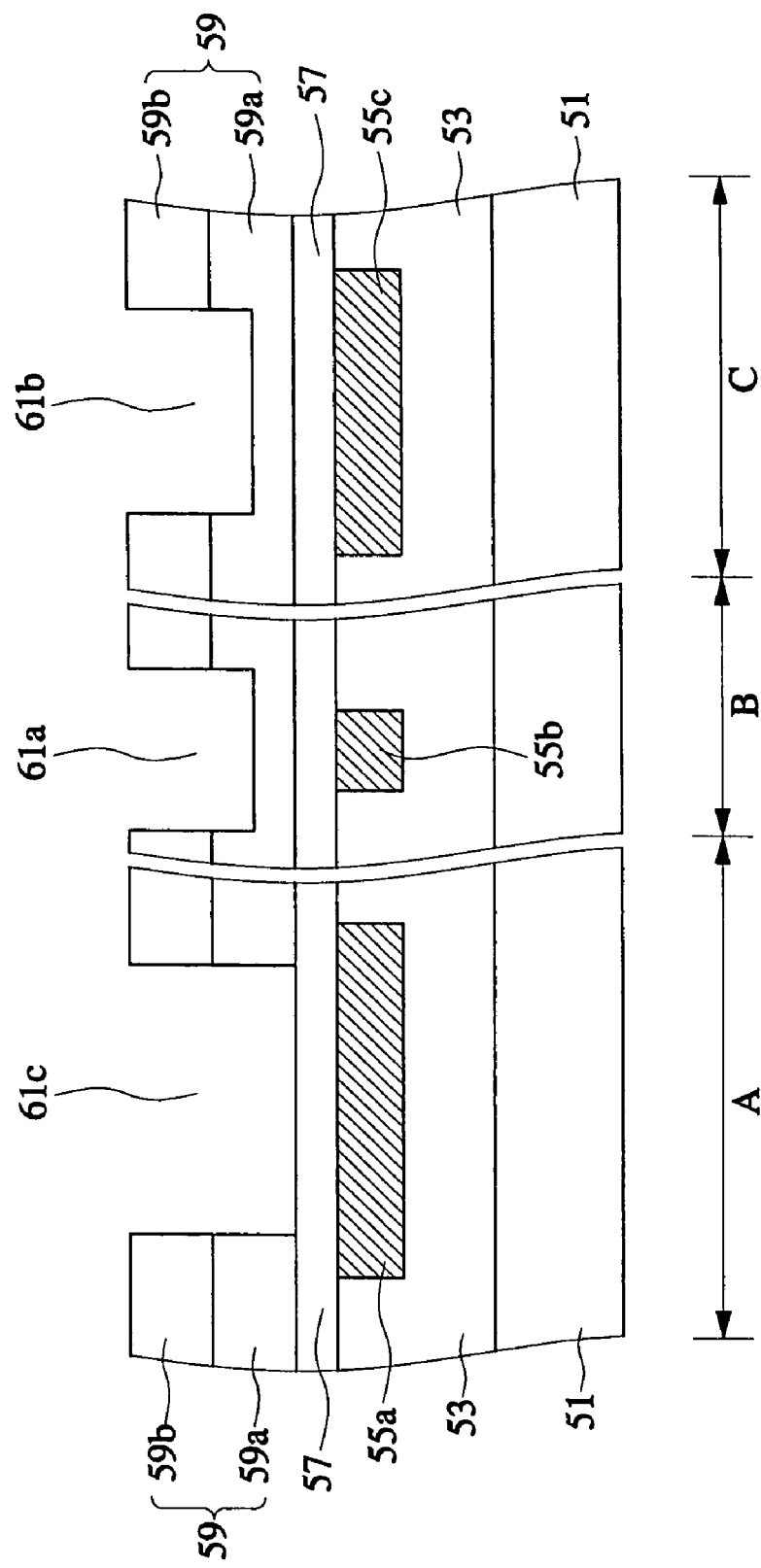

Referring to FIGS. 2 and 6, the passivation layer 59 having the preliminary fuse window 61a and the preliminary capacitor hole 61b is again patterned using a photolithography and etch process to form a preliminary pad hole 61c exposing the capping layer 57 on the metal pad 55a.

Alternatively, the preliminary pad hole 61c can be formed before the preliminary fuse window 61a and the preliminary capacitor hole 61b are formed. That is, the process sequence of patterning the preliminary pad hole 61c, and patterning the preliminary fuse window 61a and the preliminary capacitor hole 61b, can be changed.

Figure 7:
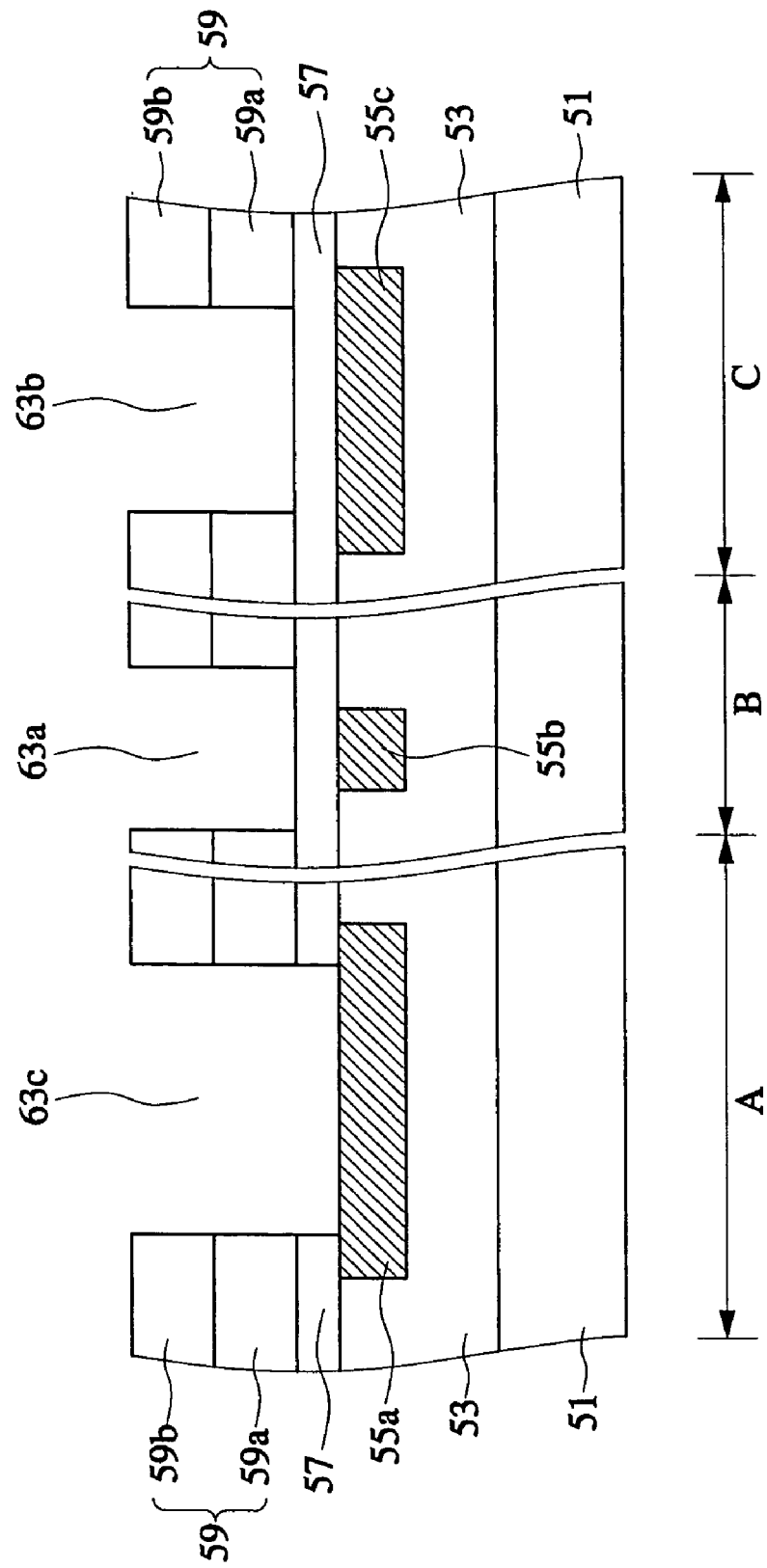

Referring to FIGS. 2 and 7, an etch back process is performed on the semiconductor substrate having the preliminary fuse window 61a, the preliminary capacitor hole 61b, and the preliminary pad hole 61c to form a fuse window 63a, a capacitor hole 63b, and a pad hole 63c. While the capping layer 57 exposed on the bottom of the preliminary pad hole 61c is removed, the passivation layer 59 that remains under the preliminary fuse window 61a and the preliminary capacitor hole 61b is removed. As a result, the capping layer 57 is exposed at the bottom of the fuse window 63a and the capacitor hole 63b, and the metal pad 55a is exposed at the bottom of the pad hole 63c.

The fuse window 63a, as shown in FIG. 2, crosses over the fuse 55b, and the capacitor hole 63b is formed to be located above the lower plate 55c. Further, the pad hole 63c is formed to be located on the metal pad 55a.

Referring to FIGS. 5 to 7, there has been illustrated the method of forming the pad hole 63c, the fuse window 63a, and the capacitor hole 63b using a partial etch and an etch back process. However, the pad hole 63c, the fuse window 63a, and the capacitor hole 63b can be formed by other various methods than that as described above.

For example, after the passivation layer 59 is formed as shown in FIG. 4, the passivation layer 59 can be patterned using a photolithography and etch process to directly form the fuse window 63a and the capacitor hole 63b exposing the capping layer 57, respectively. Then, the passivation layer 59 having the fuse window 63a and the capacitor hole 63b, and the capping layer 57 are patterned using another photolithography and etch process to form a pad hole 63c exposing the metal pad 55a. Alternatively, the pad hole 63c can be formed before the fuse window 63a and the capacitor hole 63b are formed.

Referring to FIGS. 2 and 8, an upper conductive layer is formed on the semiconductor substrate having the fuse window 63a, the capacitor hole 63b, and the pad hole 63c. Initially, the upper conductive layer is made to fill the fuse window 63a, the capacitor hole 63b, and the pad hole 63c, and to cover the passivation layer 59.

The upper conductive layer is formed of at least one conductive layer selected from the group consisting of Ta, TaN, Ti, TiN, and Al layers. The upper conductive layer may be formed of one multiple layer selected from the group consisting of Ta/TaN, Ti/TiN, TaN/Al, Ta/Al, Ta/TaN/Al, TaN/Al/TiN, TiN/Al, and Ti/TiN/Al layers. Further, the upper conductive layer may be formed as having a thickness of 500 Å to 10000 Å.

The upper conductive layer is then patterned using a photolithography and etch process to form a bonding pad 65a covering the bottom of the pad hole 63c, and an upper plate 65b covering the bottom of the capacitor hole 63b. The bonding pad 65a is electrically connected to the metal pad 55a, and the upper plate 65b is located on the capping layer 57 on the lower plate 55c. Further, the upper conductive layer filling the fuse window 63a is removed during the etch process so that the capping layer 57 on the fuse 55b is exposed through the fuse window 63a.

According to the present invention, there is provided a semiconductor device having a fuse and an MIM capacitor, that is capable of minimizing the photolithography and etch process steps. In the semiconductor device, the fuse, the lower plate and the metal pad can be formed during a same patterning process, and the fuse window and the capacitor hole can be formed using a same respective photolithography and etch process. Further, the upper conductive layer is patterned using a respective photolithography and etch process to form the bonding pad and the upper plate at the same time. Therefore, by using the process of forming the fuse and the process of forming the bonding pad, the MIM capacitor can be fabricated without additional photolithography and etch processes. In the meantime, the fuse can be formed using the process of forming the lower interconnection line. As a result, there is fabricated a semiconductor device having a fuse and a MIM capacitor in which photolithography and etch process steps have been minimized.

What is claimed is:

1. A semiconductor device comprising:
    a semiconductor substrate having a horizontal upper surface which includes a fuse area and a capacitor area;
    a fuse located over the fuse area of the horizontal upper surface of the semiconductor substrate;
    a lower plate located over the capacitor area of the horizontal upper surface of the semiconductor substrate, wherein the fuse and the lower plate extend in a same horizontal plane which is parallel to and located above the horizontal surface of the semiconductor substrate;
    an upper plate located above the lower plate; and
    a capping layer interposed between the lower plate and the upper plate.

2. The semiconductor device according to claim 1, wherein the fuse and the lower plate are formed of a Cu layer.

3. The semiconductor device according to claim 1, wherein the upper plate is at least one conductive layer selected from the group consisting of Ta, TaN, Ti, TiN and Al layers.

4. The semiconductor device according to claim 1, wherein the upper plate is one multiple layer selected from the group consisting of Ta/TaN, Ti/TiN, TaN/Al, Ta/Al, Ta/TaN/Al, TaN/Al/TiN, TiN/Al, and Ti/TiN/Al layers.

5. The semiconductor device according to claim 1, wherein the capping layer is a dielectric layer capable of preventing diffusion of Cu.

6. The semiconductor device according to claim 1, wherein the capping layer is at least one layer selected from the group consisting of SiN and SiC layers.

7. The semiconductor device according to claim 1, wherein the capping layer is extended to cover a top surface of the fuse.

8. The semiconductor device according to claim 7, further comprising:
    a passivation layer on the capping layer that covers the fuse area and the capacitor area, wherein the passivation layer has a fuse window crossing over the fuse and a capacitor hole exposing the capping layer interposed between the upper plate and the lower plate.

9. The semiconductor device according to claim 1, wherein horizontal surface of the semiconductor substrate further comprises a pad area.

10. The semiconductor device according to claim 9, further comprising:
- a metal pad located over the pad area of the horizontal surface of the substrate and extending in the same horizontal plane as the fuse and the lower plate; and
- a bonding pad placed on the metal pad and electrically connected to the metal pad, wherein the metal pad is formed of a same material layer as the fuse and the bonding pad is formed of a same material layer as the upper plate.

11. The semiconductor device according to claim 10, wherein the capping layer is extended to cover a top surface of the fuse.

12. The semiconductor device according to claim 11, further comprising:
- a passivation layer on the capping layer that covers the pad area, the fuse area, and the capacitor area, wherein the passivation layer has a pad hole exposing the metal pad, a fuse window crossing over the fuse, and a capacitor hole exposing the capping layer interposed between the upper plate and the lower plate.

* * * * *